US 6,998,770 B2

(12) United States Patent
Chae et al.

(10) Patent No.: US 6,998,770 B2
(45) Date of Patent: Feb. 14, 2006

(54) ORGANIC ELECTROLUMINESCENT DEVICE AND FABRICATING METHOD THEREOF

(75) Inventors: Gee-Sung Chae, Incheon (KR); Jae-Yong Park, Gyeonggi-do (KR); Ock-Hee Kim, Gyeonggi-do (KR)

(73) Assignee: LG. Philips LCD Co., Ltd., Seoul (KR)

( * ) Notice: Subject to any disclaimer, the term of this patent is extended or adjusted under 35 U.S.C. 154(b) by 144 days.

(21) Appl. No.: 10/330,258

(22) Filed: Dec. 30, 2002

(65) Prior Publication Data

US 2003/0205968 A1 Nov. 6, 2003

(30) Foreign Application Priority Data

May 3, 2002 (KR) ...................... 10-2002-0024551

(51) Int. Cl.
*H01J 1/62* (2006.01)
*H05B 33/00* (2006.01)
(52) U.S. Cl. .................................... 313/500
(58) Field of Classification Search ........ 313/498–500, 313/504–506, 509; 445/24; 345/204, 211, 345/76, 83, 84; 315/169.3; 257/40, 59, 257/72; 428/690
See application file for complete search history.

(56) References Cited

U.S. PATENT DOCUMENTS

| 6,215,244 | B1 * | 4/2001 | Kuribayashi et al. ....... 313/505 |
| 6,512,504 | B1 * | 1/2003 | Yamauchi et al. ....... 315/169.1 |
| 6,618,029 | B1 * | 9/2003 | Ozawa ........................ 257/40 |
| 6,714,178 | B2 * | 3/2004 | Koyama et al. ......... 315/169.4 |
| 6,809,482 | B2 * | 10/2004 | Koyama .................. 315/169.3 |
| 2001/0002703 | A1 * | 6/2001 | Koyama ...................... 257/40 |
| 2001/0043168 | A1 * | 11/2001 | Koyama et al. .............. 345/52 |

FOREIGN PATENT DOCUMENTS

KR 10-2001-107587 12/2001

* cited by examiner

*Primary Examiner*—Joseph Williams
*Assistant Examiner*—Peter Macchiarolo
(74) *Attorney, Agent, or Firm*—Morgan Lewis & Bockius

(57) ABSTRACT

An organic electroluminescent device includes a substrate, a plurality of gate lines on the substrate, a plurality of data lines on the substrate, each of the plurality of data lines crossing the gate lines, a plurality of switching elements and driving elements interconnected on the substrate, and a power line disposed in parallel to the data lines on the substrate, wherein the power line is electrically connected to at least two of the plurality of driving elements.

27 Claims, 12 Drawing Sheets

ORGANIC ELECTROLUMINESCENT DEVICE AND FABRICATING METHOD THEREOF

The present invention claims the benefit of the Korean Patent Application No. 2002-24551 filed in Korea on May 3, 2002, which is hereby incorporated by reference.

BACKGROUND OF THE INVENTION

1. Field of the Invention

The present invention relates to a semiconductor device, and more particularly, to an organic electroluminescent device and a fabricating method thereof.

2. Discussion of the Related Art

In general, an organic electroluminescent device (ELD) emits light by injecting electrons from a cathode and holes from an anode into an emission layer, combining the electrons with the holes, generating an exciton, and transitioning the exciton from an excited state to a ground state. Contrary to a liquid crystal display (LCD) device, an additional light source is not necessary for the organic ELD to emit light because the transition of the exciton between states causes light to be emitted. Accordingly, the size and weight of the organic ELD can be reduced. The organic ELD has other excellent characteristics such as low power consumption, superior brightness, and fast response time. Because of these characteristics, the organic ELD is regarded as a promising candidate for next-generation consumer electronic applications, such as cellular phones, car navigation systems (CNS), personal digital assistants (PDA), camcorders, and palmtop computers. Moreover, since fabricating the organic ELD is a simple process with few processing steps, it is much cheaper to produce an organic ELD than an LCD device.

Two different types of organic ELDs exist: passive matrix and active matrix. While both the passive matrix organic ELD and the active matrix organic ELD have a simple structure and are formed by a simple fabrication process, the passive matrix organic ELD requires a relatively high amount of power to operate. In addition, the display size of a passive matrix organic ELD is limited by its structure. Furthermore, as the number of conductive lines increases, the aperture ratio of a passive matrix organic ELD decreases. In contrast, active matrix organic ELDs are highly efficient and can produce a high-quality image for a larger display with relatively low power.

Figure 1:
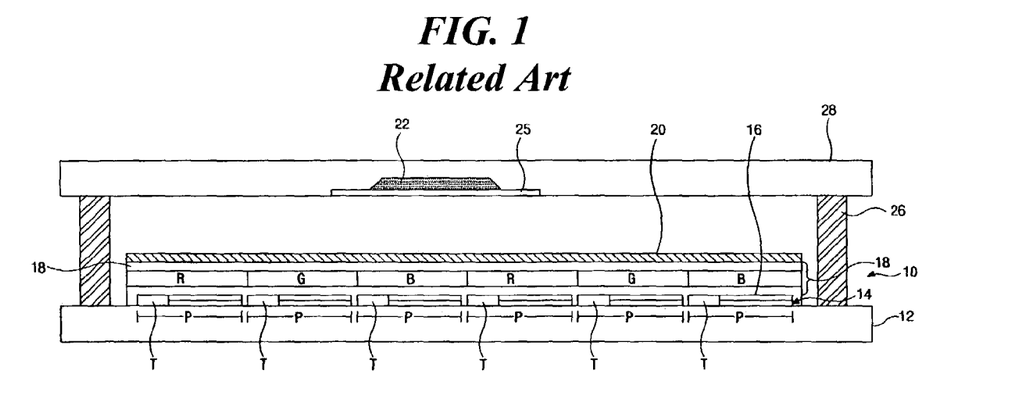
FIG. 1 is a cross-sectional view of an organic electroluminescent device according to the related art.

FIG. 1 is a cross-sectional view of an organic ELD according to the related art. In FIG. 1, an array element 14 including a thin film transistor (TFT) "T" is formed on a first substrate 12. A first electrode 16, an organic electroluminescent layer 18, and a second electrode 20 are formed over the array element 14. The organic electroluminescent layer 18 may separately display red, green, and blue colors for each pixel region. Generally, separate organic materials are used to emit light of each color for the organic electroluminescent layer 18 in each pixel region. An organic ELD is encapsulated by attaching the first substrate 12 and a second substrate 28, which includes a moisture absorbent material 22, with a sealant 26. The moisture absorbent material 22 eliminates moisture and oxygen that may penetrate into a capsule of the organic electroluminescent layer 18. After etching a portion of the second substrate 28, the etched portion is filled with the moisture absorbent material 22, and the filled moisture absorbent material is fixed by a holding element 25.

Figure 2:
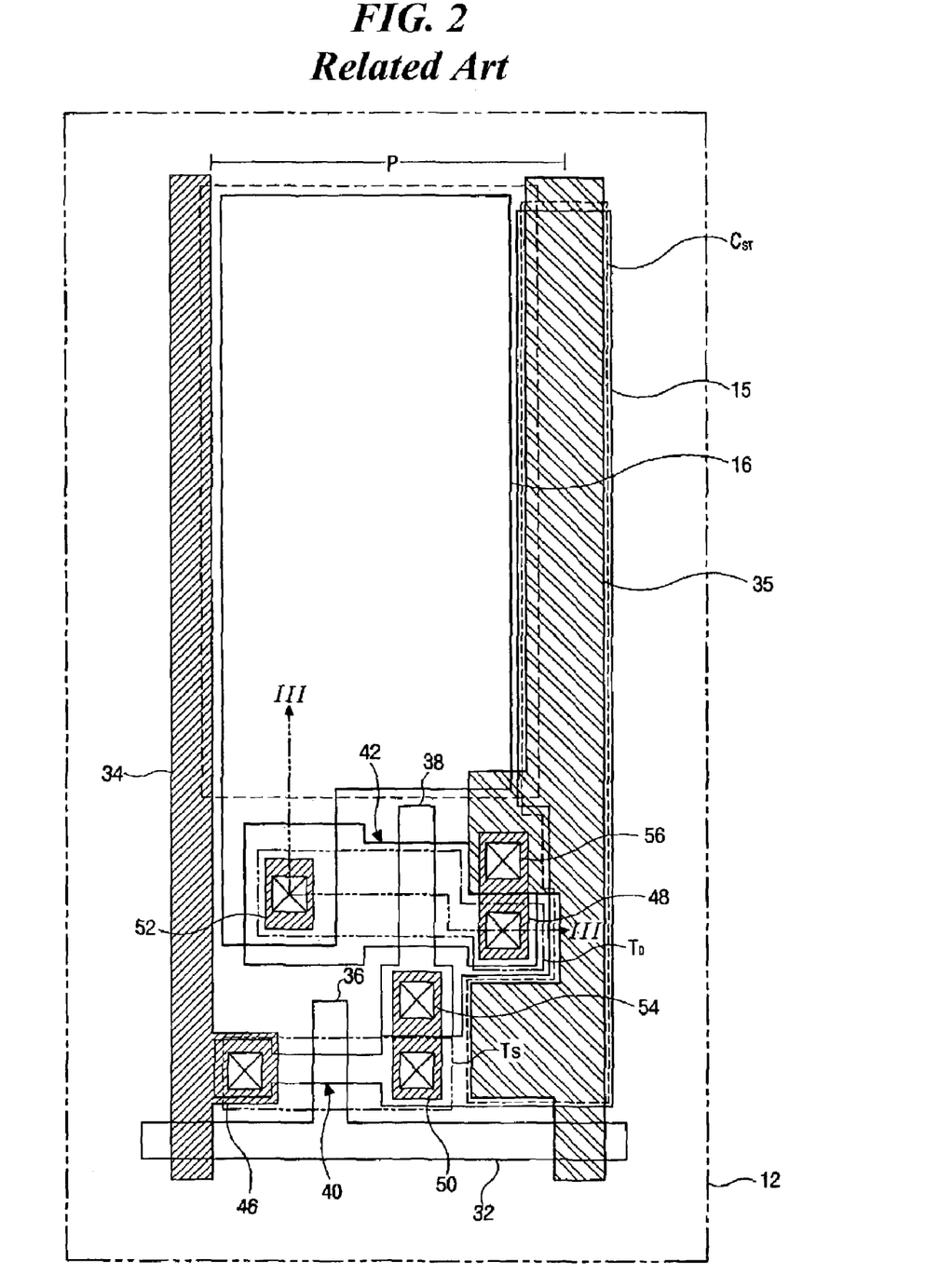
FIG. 2 is a plan view of an organic electroluminescent device according to the related art.

FIG. 2 is a plan view of an organic ELD according to the related art. In FIG. 2, a switching element $T_S$, a driving element $T_D$, and a storage capacitor $C_{ST}$ are formed in each pixel region on a substrate 12. The switching element $T_S$ and the driving element $T_D$ can be a combination of at least two thin film transistors (TFTs) according to the operating requirements of the organic ELD. The substrate 12 is made of a transparent insulating material, such as glass or plastic. Moreover, a gate line 32 and a data line 34 cross each other with an insulating layer (not shown) in between the gate line 32 and the data line 34. A power line 35 is placed in parallel to and separated from the data line 34. Two TFTs are used as the switching element $T_S$ and the driving element $T_D$. The switching element $T_S$ includes a gate electrode 36, an active layer 40, a source electrode 46, and a drain electrode 50. The driving element $T_D$ includes a gate electrode 38, an active layer 42, a source electrode 48, and a drain electrode 52. The gate electrode 36 and the source electrode 46 of the switching element $T_S$ are connected to the gate line 32 and the data line 34, respectively. The drain electrode 50 of the switching element $T_S$ is connected to the gate electrode 38 of the driving element $T_D$ through a first contact 54. The source electrode 48 of the driving element $T_D$ is connected to the power line 35 through a second contact 56. The drain electrode 52 of the driving element $T_D$ contacts a first electrode 16 in a pixel region P. The power line 35 overlaps the first electrode 16, which is composed of polycrystalline silicon, with an insulating layer interposed between the power line 35 and the first electrode 16 to form a storage capacitor $C_{ST}$.

Figure 3:
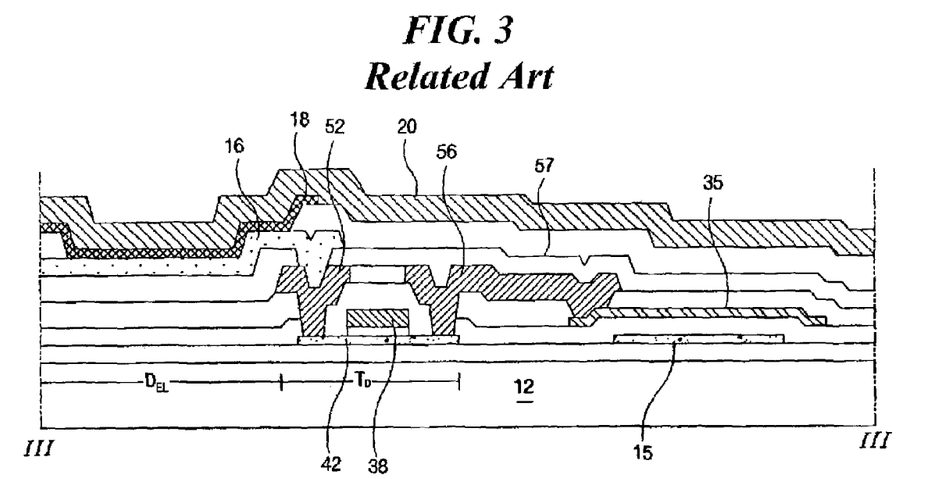
FIG. 3 is a cross-sectional view of the organic electroluminescent device of FIG. 2 taken along III—III according to the related art.

FIG. 3 is a cross-sectional view of the organic ELD shown of FIG. 2 taken along III—III according to the related art. In FIG. 3, a driving element $T_D$ including a gate electrode 38, an active layer 42, a source electrode 56, and a drain electrode 52 is formed on a substrate 12. A first electrode 16 contacting the drain electrode 52 of the driving element $T_D$ with an insulating layer interposed between the first electrode 16 and the drain electrode 52 is formed over the driving element $T_D$. An organic electroluminescent layer 18 emitting light of one color is formed on the first electrode 16, and a second electrode 20 is formed on the organic electroluminescent layer 18. The organic electroluminescent layer 18, the first electrode 16, and the second electrode 20 constitute an organic electroluminescent diode $D_{EL}$. A storage capacitor $C_{ST}$ including first capacitor electrode 15 and second capacitor electrode 35 and the driving element $T_D$ are electrically connected in parallel to the switching element $T_S$ (as shown in FIG. 2). The second capacitor electrode 35 is connected to a power line. The source electrode 56 of the driving element $T_D$ is connected to the second capacitor electrode 35. The second electrode 20 covers the driving element $T_D$, the storage capacitor $C_{ST}$, and the organic electroluminescent layer 18.

Figure 4:
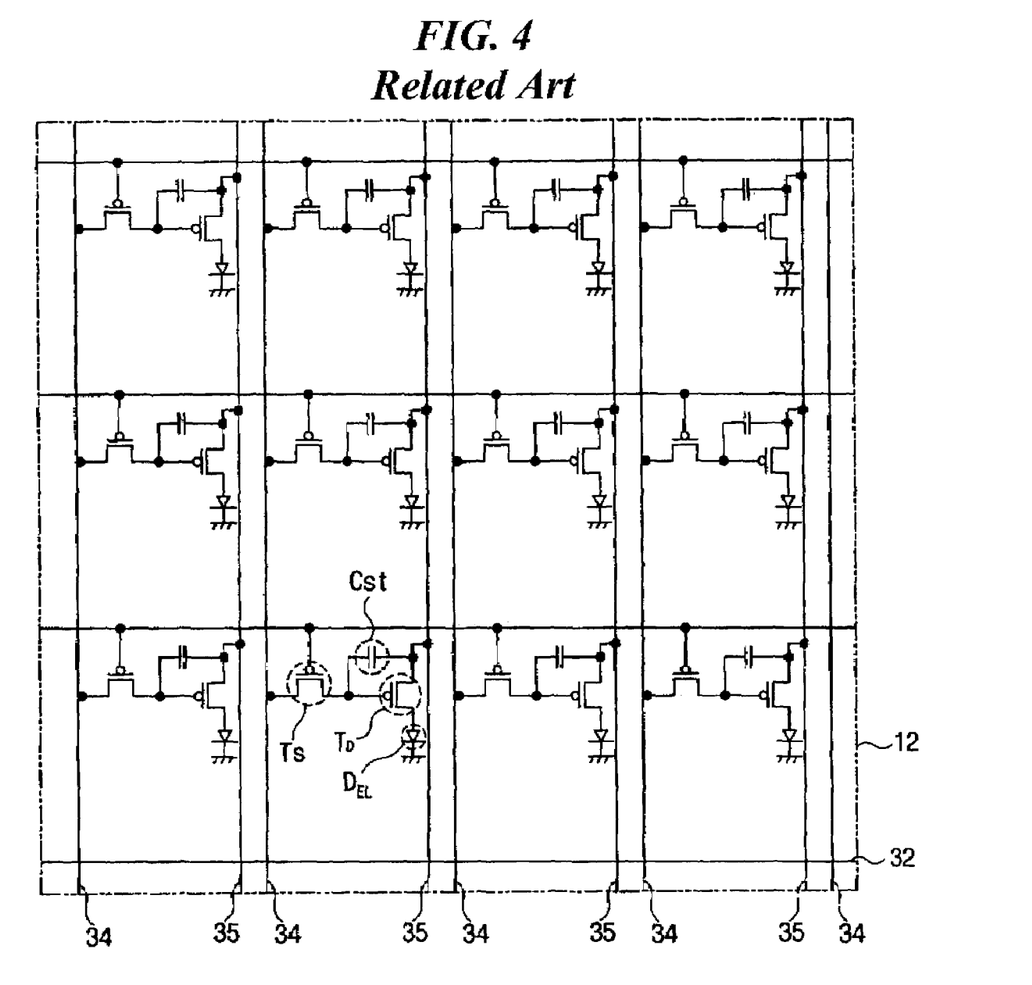
FIG. 4 is an equivalent circuit diagram of an organic electroluminescent device according to the related art.

FIG. 4 is an equivalent circuit diagram of an organic ELD according to the related art. In FIG. 4, a data line 34 is in parallel to and separated from a power line 35. A gate line 32 crosses the data line 34 and the power line 35 to define a pixel region P. A switching element $T_S$, a driving element $T_D$, and a storage capacitor $C_{ST}$ are disposed in the pixel region.

In the organic electroluminescent device according to the related art, the power line 35 limits the area of the organic electroluminescent layer. As the area of the electroluminescent layer decreases, the current density required to obtain the same brightness increases. Increasing the current density shortens the expected life span of an organic ELD. An increased current density is required to obtain sufficient brightness in a bottom emission organic ELD because the use of at least three lines causes a reduction in the aperture ratio. Moreover, as the number of conductive lines increases, the probability of defects in the conductive lines increases resulting in a decrease in the production yield.

SUMMARY OF THE INVENTION

Accordingly, the present invention is directed to an organic electroluminescent device and a fabricating method thereof that substantially obviate one or more of the problems due to limitations and disadvantages of the related art.

An object of the present invention is to provide an organic electroluminescent device where one power line is used for two adjacent pixel regions and a fabricating method thereof.

Another object of the present invention is to provide an organic electroluminescent device where an aperture ratio is improved and the expected lifetime of the device is increased, and a fabricating method thereof.

Another object of the present invention is to provide an organic electroluminescent device with a reduced probability of line defects and a fabricating method thereof.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an organic electroluminescent device includes a substrate, a plurality of gate lines on the substrate, a plurality of data lines on the substrate, each of the plurality of data lines crossing the gate lines, a plurality of switching elements and driving elements interconnected on the substrate, and a power line disposed in parallel to the data lines on the substrate, wherein the power line is electrically connected to at least two of the plurality of driving elements.

In another aspect, an organic electroluminescent device includes a first substrate, a second substrate facing and spaced apart from the first substrate, a plurality of gate lines on an inner surface of the first substrate, a plurality of data lines on an inner surface of the first substrate, each of the plurality of data lines crossing the gate lines, a plurality of switching elements and driving elements interconnected on the first substrate, a power line disposed in parallel to the data lines on the substrate and electrically connected to at least two of the plurality of driving elements, a plurality of connection electrodes connected to the plurality of driving elements, a plurality of first electrodes on an inner surface of the second substrate, an organic electroluminescent layer on the plurality of first electrodes; and a plurality of second electrodes on the organic electroluminescent layer, each of the plurality of second electrodes contacting one of the plurality of connection electrodes.

In another aspect, a method of fabricating an organic electroluminescent device includes steps of forming a plurality of switching active layers, a plurality of driving active layers, and a plurality of active patterns on a first substrate, the plurality of active patterns including polycrystalline silicon, forming a first insulating layer on the plurality of switching active layers, the plurality of driving active layers, and the plurality of active patterns, forming a plurality of switching gate electrodes on the first insulating layer to extend over the plurality of switching active layers, forming a plurality of driving gate electrodes on the first insulating layer to extend over the plurality of driving active layers, doping the plurality of switching active layers, the plurality of driving active layers, and the plurality of active patterns with impurities to form a switching source region and a switching drain region in each of the plurality of switching active layers and a driving source region and a driving drain region in each of the plurality of driving active layers, forming a second insulating layer on the plurality of switching gate electrodes and the plurality of driving gate electrodes, forming a power line on the second insulating layer, forming a third insulating layer on the power line, forming a plurality of switching source electrodes on the third insulating layer to contact the switching source region, forming a plurality of switching drain electrodes on the third insulating layer to contact the switching drain region, forming a plurality of driving source electrodes on the third insulating layer to contact the driving source region, and forming a plurality of driving drain electrodes on the third insulating layer to contact the driving drain region, wherein at least two of the plurality of driving drain electrodes are connected to the power line.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principle of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 5:
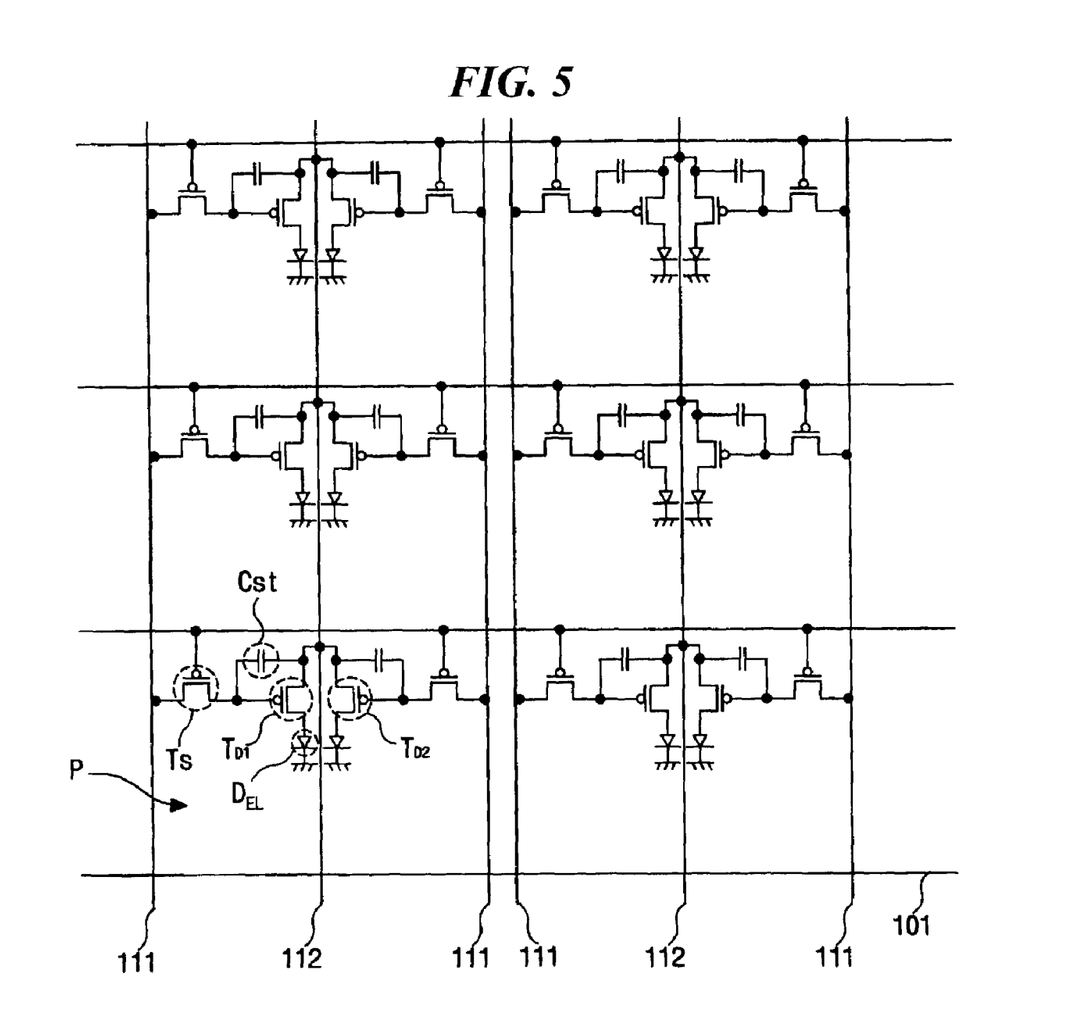
FIG. 5 is an equivalent circuit diagram of an exemplary organic electroluminescent device according to the present invention.

FIG. 5 is an equivalent circuit diagram of an exemplary organic electroluminescent device according to the present invention. In FIG. 5, a data line 111 may be in parallel to and separated from a power line 112. A gate line 101 may cross the data line 111 to define a pixel region P. A switching element $T_S$, a driving element $T_{D1}$, a storage capacitor $C_{ST}$, and an organic electroluminescent diode $D_{EL}$ may be formed in the pixel region P. The adjacent driving elements $T_{D1}$ and $T_{D2}$ of adjacent pixel regions P may be connected to the same power line 112. Since the number of the power lines 112 may be reduced by a factor of 2, the aperture ratio may increase, and the resulting device may have a resulting reduction in material cost.

Figure 6:
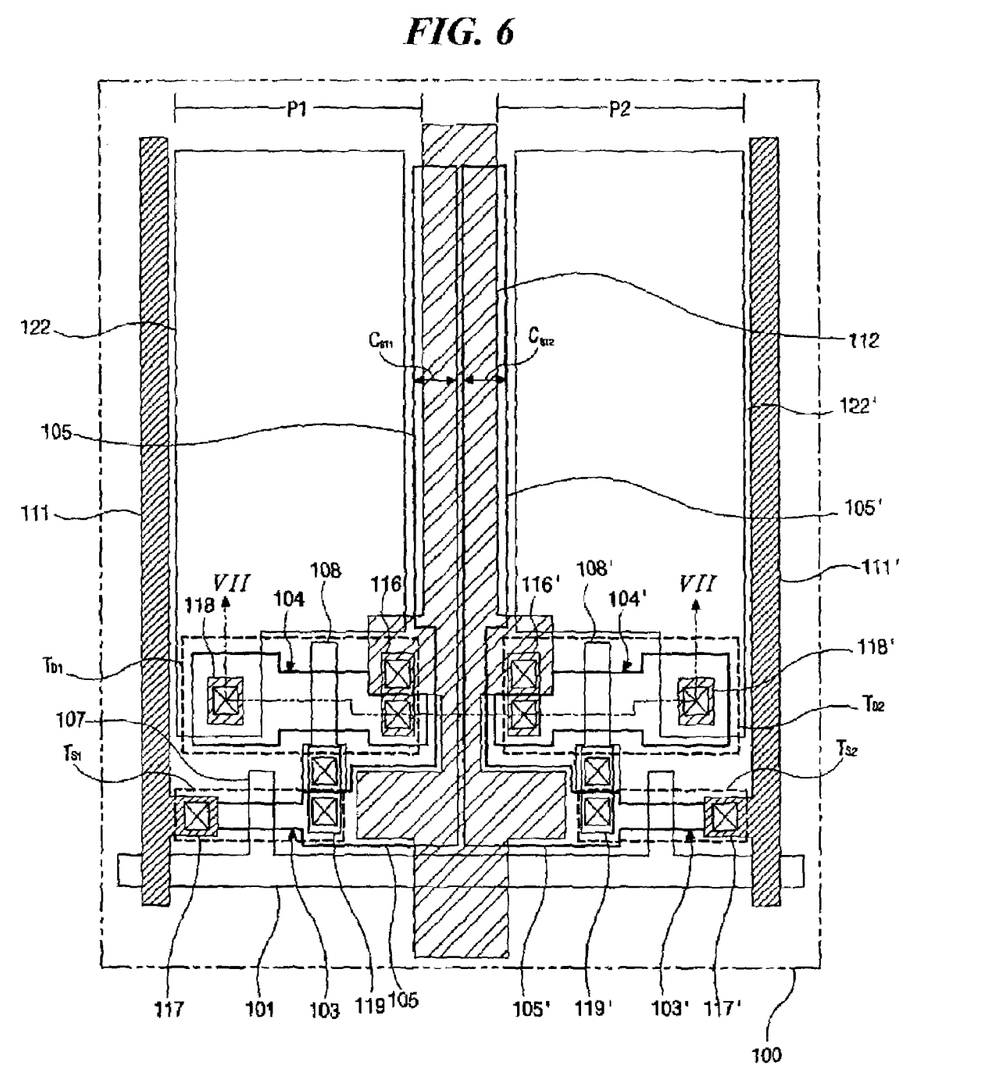
FIG. 6 is a plan view of an exemplary organic electroluminescent device according to the present invention.

FIG. 6 is a plan view of an exemplary organic electroluminescent device according to the present invention. In FIG. 6, a gate line 101 may cross a first and second data line 111 and 111' and a power line 112. The data lines 111 and 111' and the power line 112 may be in parallel to and separated from each other. The gate line 101 and the data lines 111 and 111' may define a first pixel region and a second pixel region P1 and P2, respectively, that are adjacent to each other. First and second switching elements $T_{S1}$, and $T_{S2}$, respectively, first and second driving elements $T_{D1}$ and $T_{D2}$, respectively, and first and second storage capacitors $C_{ST1}$ and $C_{ST2}$, respectively, may be formed in the respective adjacent first and second pixel regions P1 and P2. The power line 112 may be used as a common first capacitor electrode for the first storage capacitor $C_{ST1}$ and the second storage capacitor $C_{ST2}$. The first and second active patterns 105 and 105', each positioned under the power line 112, may be used as second capacitor electrodes of the first and second storage capacitors $C_{ST1}$ and $C_{ST2}$, respectively.

The first switching element $T_S$, may include a switching active layer 103, a switching gate electrode 107, a switching source electrode 117 and a switching drain electrode 119. The driving element $T_{D1}$ may include a driving active layer 104, a driving gate electrode 108, a driving source electrode 116, and a driving drain electrode 118. The switching drain electrode 119 may be electrically connected to the driving gate electrode 108. Since the switching source electrode 117 is connected to the data line 111, an image signal may be applied to the switching source electrode 117 from the data line 111. The driving drain electrode 118 may be connected to a first electrode 122 of the organic electroluminescent diode (not shown). The driving source electrode 116 may be connected to the power line 112. Structures of the second switching element $T_{S2}$ and the second driving element $T_{D2}$ may be similar to structures of the first switching element $T_{S1}$ and the first driving element $T_{D1}$, respectively. The adjacent first and second driving source electrodes 116 and 116' of the adjacent first and second pixel regions P1 and P2 may be connected to the same power line 112. Accordingly, the first and second driving elements $T_{D1}$ and $T_{D2}$ may be symmetrically disposed with respect to the power line 112 in the adjacent first and second pixel regions P1 and P2. The adjacent first and second active patterns 105 and 105', which are made of polycrystalline silicon, may extend from the respective first and second switching active layers 103 and 103' of the adjacent first and second pixel regions P1 and P2. Since the number of power lines 112 may be reduced by a factor of two, the aperture ratio of the organic electroluminescent device may be improved and line defects may be prevented. Indeed, the increased aperture ratio may be particularly beneficial to a bottom emission organic electroluminescent device because the aperture ratio of such a device is generally limited.

Figure 7A:
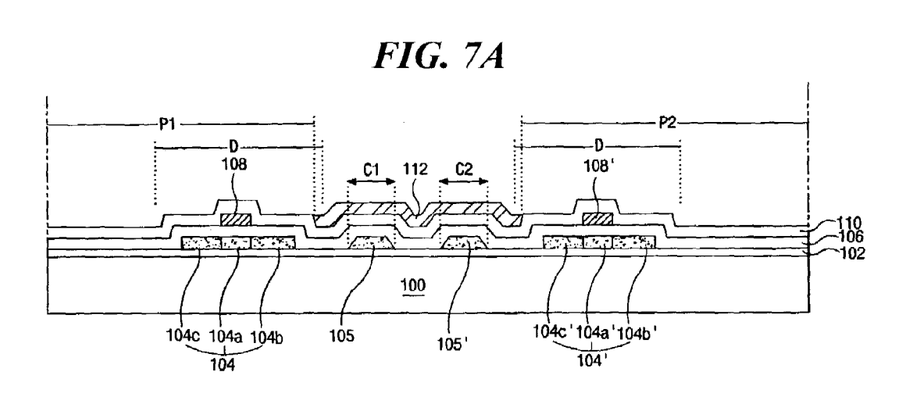
FIGS. 7A to 7E are cross-sectional views of the exemplary organic electroluminescent device of FIG. 6 taken along VII—VII, showing an exemplary fabricating method of an organic electroluminescent device according to the present invention.

FIGS. 7A to 7E are cross-sectional views of the exemplary organic electroluminescent device of FIG. 6 taken along VII—VII, showing an exemplary fabricating method of an organic electroluminescent device according to the present invention. In FIG. 7A, a buffer layer 102 (i.e., a first insulating layer) of an insulating material may be formed on a substrate 100 including adjacent first and second pixel regions P1 and P2 and adjacent first and second capacitor regions C1 and C2. Each pixel region P1 and P2 may include a switching region (not shown) and a driving region D. A first switching active layer (not shown), a first driving active layer 104, and a first active pattern 105, which is made of polycrystalline silicon, may be formed on the buffer layer 102 in the switching region, driving region D and capacitor region C1. Similarly, a second switching active layer (not shown), a second driving active layer 104', and a second active pattern 105', which is made of polycrystalline silicon, may be formed on the buffer layer 102 in the switching region, driving region D and capacitor region C2. The first and second active patterns 105 and 105' of the adjacent capacitor regions C1 and C2 may extend from the first and second switching active layers of the switching regions of the adjacent pixel regions P1 and P2, respectively. After a gate insulating layer 106 (i.e., a second insulating layer) is formed on an entire surface of the substrate 100, first and second switching gate electrodes (not shown) and first and second driving gate electrode 108 and 108' may be formed on the gate insulating layer 106 over the respective first and second switching active layers and first and second driving active layers 104 and 104'. The gate insulating layer 104 may include an inorganic insulating material, such as silicon nitride ($SiN_x$) or silicon oxide ($SiO_2$). The first and second switching gate electrodes and the first and second driving gate electrodes 108 and 108' may include a conductive metallic material, such as aluminum (Al), aluminum alloy, copper (Cu), tungsten (W), tantalum (Ta), or molybdenum (Mo). The gate insulating layer 106 may be etched to have the same patterns as the first and second switching gate electrodes and the first and second driving gate electrodes 108 and 108'.

Next, the first and second switching active layers, the first and second driving active layers 104 and 104', and the first and second active patterns 105 and 105' may be doped with impurities. Since the first driving gate electrode 108 may be used as a doping mask, the first driving active layer 104 may be divided into a first driving channel region 104a, a first driving source region 104b, and a first driving drain region 104c. Similarly, the second driving active layer 104' may be divided into a second driving channel region 104a', a second driving source region 104b', and a second driving drain region 104c'. Even though not shown in FIG. 7A, the first and second switching active layers may also be divided into first and second switching channel regions, first and second switching source regions, and first and second switching drain regions.

Subsequently, an interlayer insulating layer 110 (i.e., a third insulating layer) may be formed on the entire surface of the substrate 100. The interlayer insulating layer 110 may include an inorganic insulating material, such as silicon nitride ($SiN_x$) or silicon oxide ($SiO_2$). A power line 112 may be formed on the interlayer insulating layer 110 between the adjacent pixel regions P1 and P2. The power line 112 may include a conductive metallic material, such as aluminum (Al), aluminum alloy, copper (Cu), tungsten (W), tantalum (Ta), or molybdenum (Mo).

Figure 7B:
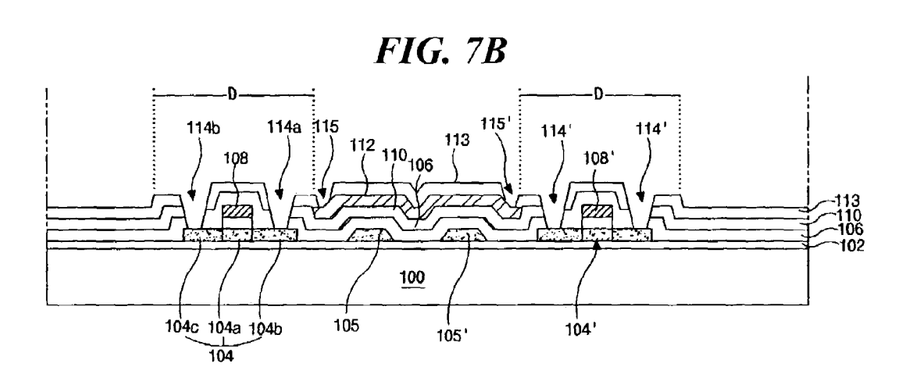

In FIG. 7B, a fourth insulating layer 113 having first and second switching source contact holes (not shown), first and second switching drain contact holes (not shown), first and second driving source contact holes 114a and 114a', first and second driving drain contact holes 114b and 114b', and first and second power contact holes 115 and 115' may be formed on the entire surface of the substrate 100. The first driving source contact hole 114a and the first driving drain contact hole 114b may expose the first driving source region 104b and the first driving drain region 104c, respectively. Similarly, the first switching source contact hole and the first switching drain contact hole may expose the first switching source region and the first switching drain region, respectively (not shown in FIG. 7B). The first and second power contact holes 115 and 115' exposing the power line 112 may be disposed adjacent to the respective driving regions D of the adjacent pixel regions P1 and P2.

Figure 7C:
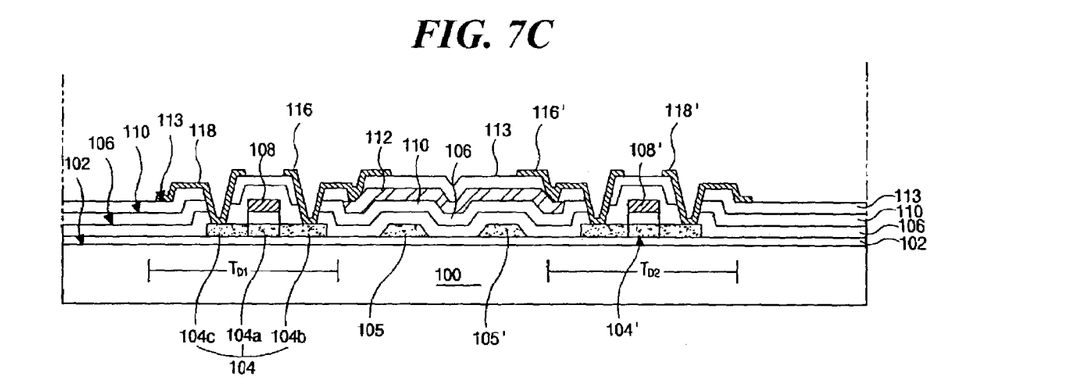

In FIG. 7C, first and second switching source electrodes (not shown), first and second switching drain electrodes (not shown), first and second driving source electrodes 116 and 116', and first and second driving drain electrodes 118 and 118' may be formed on the fourth insulating layer 113 by depositing and patterning a conductive metallic material, such as aluminum (Al), aluminum alloy, copper (Cu), tungsten (W), tantalum (Ta), or molybdenum (Mo). The first driving source electrode 116 and the first driving drain electrode 118 may be connected to the first driving source region 104b and the first driving drain region 104c, respectively. Similarly, the first switching source electrode and the first switching drain electrode may be connected to the first switching source region and the first switching drain region, respectively (not shown in FIG. 7C). The first and second driving source electrodes 116 and 116' may be connected to the same power line 112 through the first and second power contact holes 115 and 115'. As a result, the same source voltage may be applied to first and second driving elements $T_{D1}$ and $T_{D2}$ of the adjacent pixel regions P1 and P2 through the same power line 112. The first and second driving elements $T_{D1}$ and $T_{D2}$ may be symmetrically disposed with respect to the power line 112. The first and second driving gate electrodes 108 and 108' may be connected to the first and second switching drain electrodes (not shown), respectively.

Figure 7D:
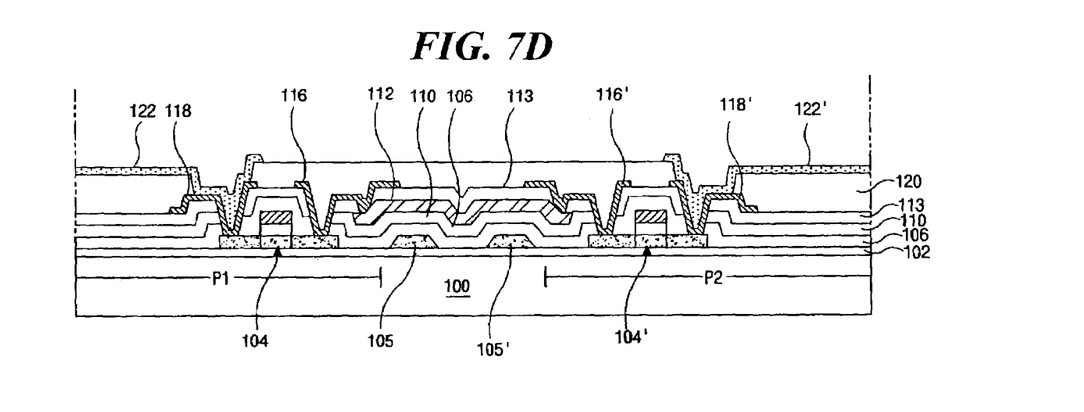

In FIG. 7D, after a fifth insulating layer 120 is formed on an entire surface of the substrate 100, the first and second driving drain electrodes 118 and 118' may be exposed. First and second lower electrodes 122 and 122' may be formed on the fifth insulating layer 120. The first and second lower electrodes 122 and 122' may be connected to the first and second driving drain electrodes 118 and 118', respectively. Moreover, the first and second lower electrodes 122 and 122' may extend to the first and second pixel regions P1 and P2, respectively. The first and second lower electrodes 122 and 122' may function as an anode that injects holes. The first and second lower electrodes 122 and 122' may include a material of a high work function, such as indium-tin-oxide (ITO) or indium-zinc-oxide (IZO).

Figure 7E:
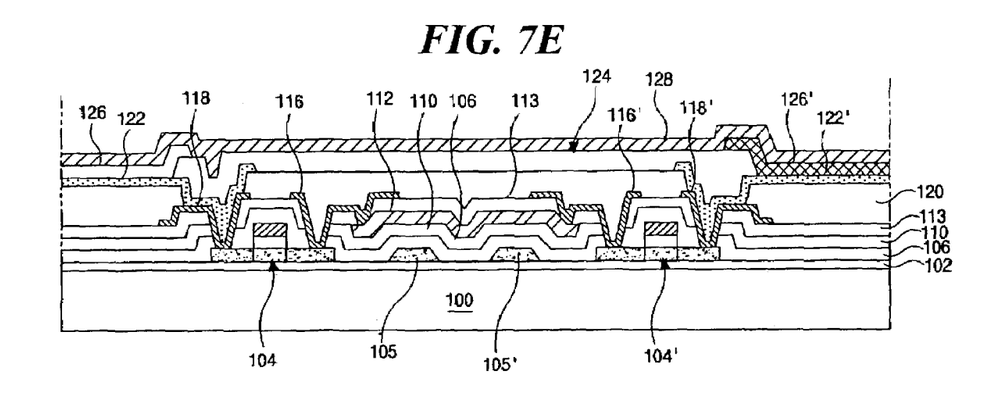

In FIG. 7E, after a sixth insulating layer 124 is formed on an entire surface of the substrate 100, the first and second lower electrodes 122 and 122' may be exposed. First and second organic electroluminescent layers 126 and 126' may be formed on the first and second lower electrodes 122 and 122', respectively. An upper electrode 128 may be formed on the entire surface of the substrate 100. The upper electrode 128 may function as a cathode injecting electrons. The upper electrode 128 may include a metallic material, such as calcium (Ca), aluminum (Al), or magnesium (Mg).

In another embodiment, array elements and organic electroluminescent diodes may be formed on individual substrates. Subsequently, the individual substrates may be attached.

Figure 8:
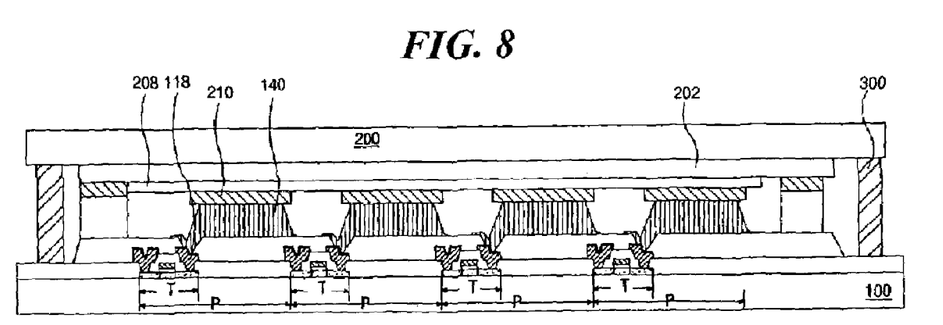
FIG. 8 is a cross-sectional view of an another exemplary organic electroluminescent device according to the present invention.

FIG. 8 is a cross-sectional view of another exemplary organic electroluminescent device according to the present invention. In FIG. 8, a first substrate 100 may face and be separated from a second substrate 200. An array element including a TFT "T" may be formed on an inner surface of the first substrate 100, and a first electrode 202 that inject electrons, an organic electroluminescent layer 208, and a second electrode 210 that inject holes may be formed on an inner surface of the second substrate 200. The first and second substrates 100 and 200 may be bonded together with a sealant 300. A connection pattern 140, which is connected to the TFT "T," may contact the second electrode 210 during the process of attaching the first substrate 100 to the second substrate 200. The array element may be fabricated through the process described in reference to FIGS. 7A to 7C except that a forming step for the connection pattern 140 may be added.

Figure 9A:
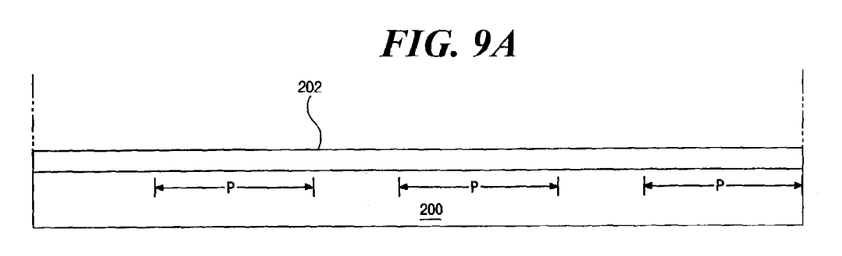
FIGS. 9A to 9C are cross-sectional views of another exemplary fabricating process of an organic electroluminescent diode according to the present invention.
Figure 9B:
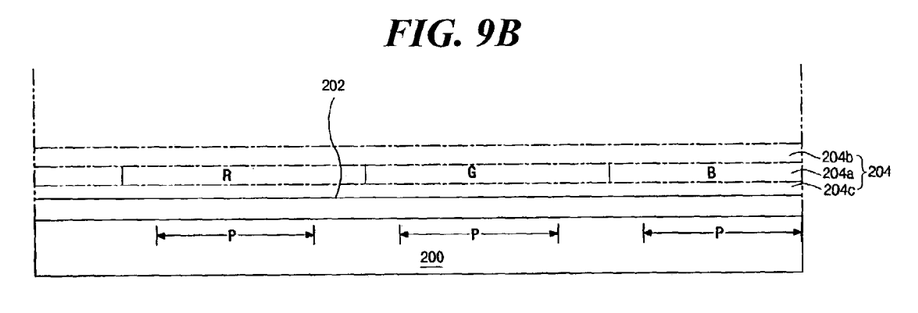
Figure 9C:
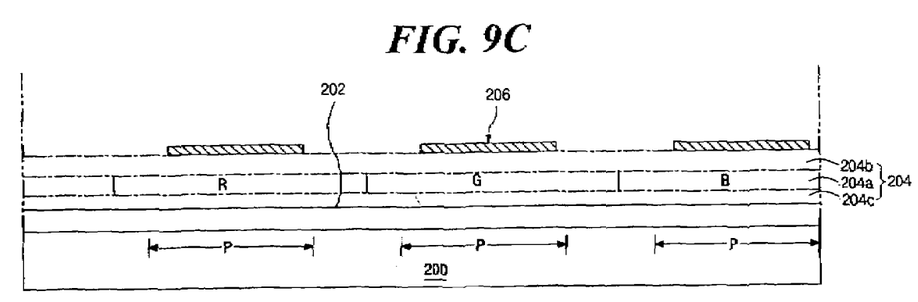

FIGS. 9A to 9C are cross-sectional views of an exemplary fabricating process of an organic electroluminescent diode according to the present invention. In FIG. 9A, a first electrode 202 may be formed on a substrate 200. The first electrode 202 may function as a cathode injecting electrons into an organic electroluminescent layer (not shown). The first electrode 202 may include aluminum (Al), calcium (Ca), magnesium (Mg), or two layers of lithium fluoride/aluminum (LiF/Al), for example.

In FIG. 9B, an organic electroluminescent layer 204 may be formed on the first electrode 202. The organic electroluminescent layer 204 may emit red, green, or blue light and may correspond to a pixel region P. The organic electroluminescent layer 204 may have a single layer structure or a multi layer structure. The organic electroluminescent layer 204 with a multi layer structure may include an emission layer 204a, a hole transporting layer 204b, and an electron transporting layer 204c.

In FIG. 9C, a second electrode 206 may be formed on the organic electroluminescent layer 204. The second electrode 206 may function as an anode that injects holes into the organic electroluminescent layer 204 and may correspond to the pixel region P. The second electrode 206 may include a conductive material having a high work function, such as indium-tin-oxide (ITO) or indium-zinc-oxide (IZO).

After the organic electroluminescent diode is formed on the second substrate, the second substrate may be bonded to the first substrate that has the array element such that the second electrode of the second substrate contacts the connection pattern of the first substrate.

Since the disclosed organic electroluminescent device has one power line for two adjacent driving elements of two adjacent pixel regions, the number of power lines is reduced by a factor of two. As a result, the aperture ratio of the disclosed organic electroluminescent device is improved. Moreover, since the disclosed organic electroluminescent device reduces line defects and decreases material cost, the production yield for organic electroluminescent devices is improved. Indeed, the increased aperture ratio resulting from the disclosed organic electroluminescent device may be particularly beneficial to a bottom emission organic electroluminescent device because the aperture ratio of a bottom emission organic electroluminescent device is generally limited.

It will be apparent to those skilled in the art that various modifications and variations can be made in the organic electroluminescent device and fabricating method thereof of the present invention without departing from the spirit or scope of the invention. Thus, it is intended that the present invention cover the modifications and variations of this invention provided they come within the scope of the appended claims and their equivalents.

What is claimed is:

1. An organic electroluminescent device, comprising:
   a substrate;
   a plurality of gate lines on the substrate;
   a plurality of data lines on the substrate, each of the plurality of data lines crossing the gate lines;
   a plurality of switching elements and driving elements interconnected on the substrate; and
   a power line disposed in parallel to the data lines on the substrate,
   wherein the power line is electrically connected to at least two of the plurality of driving elements and active patterns of at least two of the plurality of switching elements extend parallel along a lengthwise direction of the power line and each active pattern overlaps only one side of the power line.

2. The device according to claim 1, wherein each of the plurality of driving elements includes a thin film transistor having a gate electrode, an active layer, a source electrode, and a drain electrode.

3. The device according to claim 2, wherein the power line is connected to the source electrodes of the at least two of the plurality of driving elements.

4. The device according to claim 2, further comprising:
   a plurality of first driving electrodes, each of the plurality of first driving electrodes connected to one of the plurality of driving elements;
   an organic electroluminescent layer on the plurality of first driving electrodes; and
   a plurality of second electrodes on the organic electroluminescent layer.

5. The device according to claim 4, wherein the plurality of first driving electrodes are connected to the drain electrodes of the plurality of driving elements.

6. The device according to claim 4, wherein each of the plurality of first driving electrodes is an anode that injects holes into the organic electroluminescent layer and each of the plurality of second electrodes is a cathode that injects electrons into the organic electroluminescent layer.

7. The device according to claim 6, wherein each of the plurality of first driving electrodes includes at least one of indium-tin-oxide (ITO) and indium-zinc-oxide(IZO).

8. The device according to claim 6, wherein each of the plurality of second electrodes includes at least one of calcium (Ca), aluminum (Al), and magnesium (Mg).

9. The device according to claim 4, wherein the plurality of switching elements are connected to the plurality of gate lines and data lines.

10. The device according to claim 9, wherein the plurality of driving elements are connected to the plurality of switching elements.

11. The device according to claim 1, wherein each of the active patterns include a first portion extending between adjacent pixel regions in parallel to the data lines and a second portion extending parallel to the gate lines.

12. The device according to claim 11, wherein the power line overlaps the first portion of the active patterns.

13. The device according to claim 11, wherein the power line overlaps the first and second portions of the active patterns.

14. The device according to claim 1, wherein the power line overlaps the active patterns.

15. The device according to claim 1, wherein at least two of the plurality of driving elements are symmetrically disposed with respect to the power line.

16. An organic electroluminescent device, comprising:
    a first substrate;
    a second substrate facing and spaced apart from the first substrate;
    a plurality of gate lines on an inner surface of the first substrate;
    a plurality of data lines on an inner surface of the first substrate, each of the plurality of data lines crossing the gate lines;
    a plurality of switching elements and driving elements interconnected on the first substrate;
    a power line disposed in parallel to the data lines on the substrate and electrically connected to at least two of the plurality of driving elements;
    a plurality of connection electrodes connected to the plurality of driving elements;
    a plurality of first electrodes on an inner surface of the second substrate;
    an organic electroluminescent layer on the plurality of first electrodes; and
    a plurality of second electrodes on the organic electroluminescent layer, each of the plurality of second electrodes contacting one of the plurality of connection electrodes.

17. The device according to claim 16, wherein each of the plurality of driving elements includes a thin film transistor having a gate electrode, an active layer, a source electrode, and a drain electrode.

18. The device according to claim 17, wherein the power line is connected to the source electrodes of at least two of the plurality of driving elements.

19. The device according to claim 17, wherein the plurality of connection electrodes contact the drain electrodes of the plurality of driving elements.

20. The device according to claim 16, wherein each of the plurality of first electrodes is a cathode that injects electrons into the organic electroluminescent layer and each of the plurality of second electrodes is an anode that injects holes into the organic electroluminescent layer.

21. The device according to claim 20, wherein each of the plurality of first electrodes includes at least one of calcium (Ca), aluminum (Al) and magnesium (Mg).

22. The device according to claim 20, wherein each of the plurality of second electrodes includes at least one of indium-tin-oxide (ITO) and indium-zinc-oxide (IZO).

23. The device according to claim 16, wherein the plurality of switching elements are connected to the plurality of gate lines and data lines.

24. The device according to claim 16, further comprising a plurality of active patterns extending from at least two of the plurality of switching elements.

25. The device according to claim 24, wherein the power line overlaps the plurality of active patterns.

26. The device according to claim 16, wherein at least two of the plurality of driving elements are symmetrically disposed with respect to the power line.

27. The device according to claim 16, wherein active patterns of at least two of the plurality of switching elements extend parallel along a lengthwise direction of the power line.

* * * * *